(12) United States Patent
Dross et al.

(10) Patent No.: US 10,529,897 B2
(45) Date of Patent: Jan. 7, 2020

(54) LED-BASED LIGHTING DEVICE WITH ASYMMETRICALLY DISTRIBUTED LED CHIPS

(71) Applicant: KONINKLIJKE PHILIPS N.V., Eindhoven (NL)

(72) Inventors: Oliver Dross, Aachen (DE); Michel Cornelis Josephus Marie Vissenberg, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 20 days.

(21) Appl. No.: 15/555,923

(22) PCT Filed: Feb. 25, 2016

(86) PCT No.: PCT/EP2016/053924
§ 371 (c)(1),
(2) Date: Sep. 5, 2017

(87) PCT Pub. No.: WO2016/142179
PCT Pub. Date: Sep. 15, 2016

(65) Prior Publication Data
US 2018/0069158 A1 Mar. 8, 2018

(30) Foreign Application Priority Data

Mar. 6, 2015 (EP) ..................................... 15157990

(51) Int. Cl.
*H01L 33/48* (2010.01)
*H01L 25/075* (2006.01)
(Continued)

(52) U.S. Cl.
CPC ........ *H01L 33/486* (2013.01); *H01L 25/0753* (2013.01); *H01L 33/508* (2013.01); *H01L 33/58* (2013.01)

(58) Field of Classification Search
CPC ... H01L 33/486; H01L 33/58; H01L 25/0753; H01L 33/508
See application file for complete search history.

(56) References Cited

U.S. PATENT DOCUMENTS

| 9,506,632 | B2 | 11/2016 | Ogata et al. |
| 2004/0201987 | A1* | 10/2004 | Omata .................. H01L 33/486 362/230 |

(Continued)

FOREIGN PATENT DOCUMENTS

| CN | 103748405 A | 4/2014 |
| EP | 2590216 A2 | 5/2013 |
| WO | 2013037584 A1 | 3/2013 |

OTHER PUBLICATIONS

EPO as ISA, "International Search Report and Written Opinion" dated Apr. 29, 2016 from International Application No. PCT/EP2016/053924, filed Feb. 25, 2016, 11 pages.

(Continued)

*Primary Examiner* — Cuong B Nguyen
*Assistant Examiner* — Samuel Park

(57) ABSTRACT

A lighting device is provided that allows a reduced color separation. The lighting device is configured to emit light along an output direction. The lighting device comprises a base, two or more light emitting diode, LED, chips and a light transmissive dielectric material. The two or more LED chips are asymmetrically distributed on the base and are configured to emit light in the output direction. The light transmissive dielectric material may be embedding the two or more chips and includes luminescent material. A first chip of the one or more LED chips is arranged so that one corner of the first chip coincides, or at least closely, coincides with a central axis of the lighting device.

7 Claims, 2 Drawing Sheets

(51) Int. Cl.
*H01L 33/50* (2010.01)
*H01L 33/58* (2010.01)

(56) References Cited

U.S. PATENT DOCUMENTS

| | | | | |
|---|---|---|---|---|
| 2005/0052378 | A1* | 3/2005 | Hacker | F21K 9/00 345/84 |
| 2005/0122031 | A1* | 6/2005 | Itai | H01L 33/486 313/498 |
| 2005/0133939 | A1* | 6/2005 | Chikugawa | H01L 33/60 257/790 |
| 2005/0239227 | A1* | 10/2005 | Aanegola | H01L 33/52 438/26 |
| 2007/0109779 | A1* | 5/2007 | Sekiguchi | G02F 1/133603 362/249.01 |
| 2008/0041625 | A1* | 2/2008 | Cheong | H01L 33/60 174/521 |
| 2008/0149945 | A1* | 6/2008 | Nagai | F21K 9/00 257/88 |
| 2008/0296590 | A1* | 12/2008 | Ng | H01L 33/486 257/88 |
| 2009/0115313 | A1 | 5/2009 | Lu et al. | |
| 2009/0184616 | A1* | 7/2009 | Van De Ven | H05B 33/086 313/1 |
| 2011/0215349 | A1* | 9/2011 | An | H01L 33/486 257/89 |
| 2011/0291131 | A1* | 12/2011 | Ito | H01L 33/54 257/93 |
| 2012/0056217 | A1 | 3/2012 | Jung et al. | |
| 2013/0106276 | A1* | 5/2013 | Miyairi | H01L 25/0753 313/498 |
| 2013/0223072 | A1* | 8/2013 | Castillo | F21V 5/04 362/245 |

OTHER PUBLICATIONS

Extended European Search Report dated Sep. 2, 2015 from European Patent Application No. 15157990.1 filed Mar. 6, 2015, 8 pages.
CN First Office Action dated Jan. 2, 2019, China Patent Application No. 201680014177.4, 14 pages.
Second Office Action dated Sep. 6, 2019, Chinese Patent Application No. 201680014177.4, 8 pages.

* cited by examiner

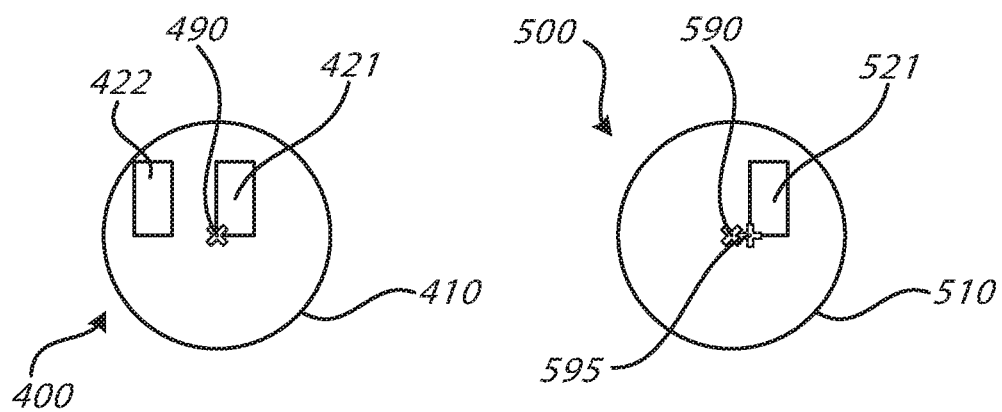
Fig. 4
Fig. 5
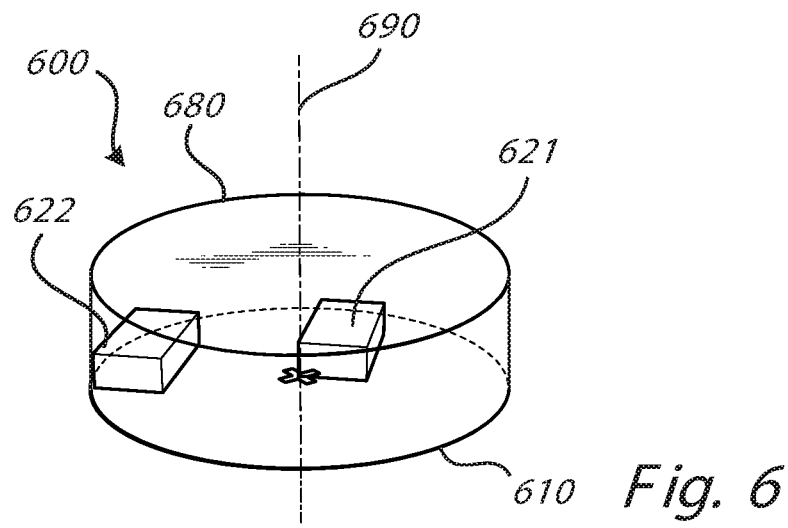
Fig. 6
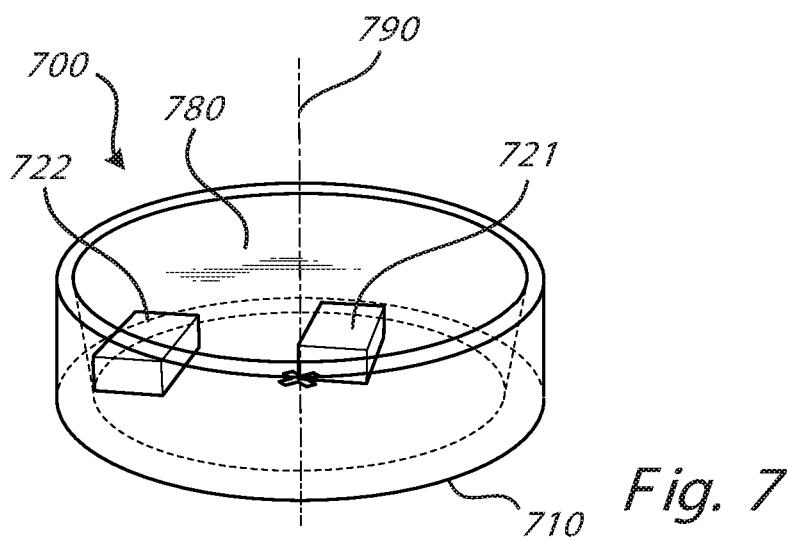
Fig. 7

LED-BASED LIGHTING DEVICE WITH ASYMMETRICALLY DISTRIBUTED LED CHIPS

CROSS-REFERENCE TO RELATED APPLICATIONS

The present application is a § 371 application of International Application No. PCT/EP2016/053924 filed on Feb. 25, 2016 and titled "LED-BASED LIGHTING DEVICE WITH ASYMMETRICALLY DISTRIBUTEDLED CHIPS," which claims the benefit of European Patent Application No. 15157990.1 filed on Mar. 6, 2015. International Application No. PCT/EP2016/053924 and European Patent Application No. 15157990.1 are incorporated herein.

TECHNICAL FIELD

The present specification generally relates to the field of lighting devices based on light emitting diodes (LEDs) and particularly discloses a lighting device with asymmetrically mounted LED chips.

TECHNICAL BACKGROUND

Generally, mid and low power LED-based lighting devices comprise a white cup, one or more LED chips for emitting blue light and a phosphorous light transmitting dielectric for converting the wavelength of the emitted blue light. The emitted blue light reaching the wavelength converting phosphor will usually result in yellow light (depending on the properties of the wavelength converting phosphor). Although some of the light output from the LED-based lighting device may be yellow, the output light will have a different spectral composition due to the fact that various light rays emitted at different angles from the LED chips pass an unequal amount of phosphor.

Hence, there will be a spatially depending difference in spectral composition in the light emitted from the LED-based lighting device, which is called color over position (COP).

Light from a LED-based lighting device exhibiting such COP will, after passing a collimator, result in an angular difference in spectral composition in the far field, called color over angle (COA).

A problem with using LED-based lighting devices showing COA in spot applications is that severe coloration in the fringe of a pattern can occur, especially for narrow light beams.

SUMMARY

An object of the present invention is to provide a lighting device which at least partly overcomes some of the problems stated above. In particular, it is an object to provide a lighting device with reduced color separation.

The above-mentioned objects are achieved by the present invention according to the independent claim. Preferred embodiments are set forth in the dependent claims.

For example, in one embodiment, a lighting device configured to emit light along an output direction is provided. The device comprises a base, two or more light emitting diode, LED, chips and a light transmissive dielectrical material. On the base, two or more LED chips are asymmetrically distributed with respect to a central axis of the lighting device. The two or more LED chips are configured to emit light in the output direction. The light transmissive dielectric material is embedding the two or more LED chips. The light transmissive dielectric material includes luminescent material. A first chip of the two or more LED chips is arranged so that one corner of the first chip coincides, or at least closely coincides, with the central axis of the lighting device.

In the above embodiment, it has been realized that far field angular differences in spectral composition produced by a typical collimator is in fact not primarily caused by angular differences in spectral composition of the non-collimated LED in itself, but by a spatially depending difference in spectral composition. In a lighting device, the placement of the LED chips results in spatially depending differences in spectral composition in the non-collimated light. This spatially depending differences result in angularly depending differences in spectral composition when the light has passed the collimator. Hence, by providing an improved chip placement, a lighting device with improved COA can be achieved.

Further, it has been realized that the COA of the light beam after passing a collimator and/or mixing element depends primarily on the rotational average of the spatially depending difference in spectral composition. Hence, mixing the position of the LED chips in a radial direction will have a positive impact on the COA.

A lighting device according to the above embodiment is advantageous in that it reduces the need for dedicated optics to mix the colors. As a result, intensity losses and other defects from mixing optics can be avoided and a narrower beam with a higher intensity can be obtained.

It will be appreciated that the base of a lighting device may be flat, concave, convex, an uneven surface, or any combination thereof.

The term "output direction" in the present disclosure means the direction in which light output from the optical device during its intended usage is directed.

The term "asymmetrically distributed" in the present disclosure means a distribution with an absence of symmetry, especially an absence of rotational symmetry with respect to a central axis of the lighting device. For example, an asymmetrical distribution of LED chips will change its overall shape on rotation around a central axis for all angles except for 360 degrees. In the present context, under the constraints set forth above on the corner of the first chip, the LED chips may be randomly distributed on the base.

The term "closely coincides" in the present disclosure means that a point is within a distance, in a specific direction, not larger than 1/10 of the size of the base, as measured in the same direction, from a specified position.

The term "in contact with the edge" means an arrangement where an edge of a LED chip is in contact with, or close or adjacent to, the edge of the base. Due to the operation of manufacturing machines, a gap of typically 0.1 to 0.2 mm to the edge of the base will be needed, and this is considered to be close to, or in contact with, the edge of the base.

In one embodiment, a second chip of the two or more LED chips is arranged at an edge of the base so that a longest side of the second chip is aligned with the edge of the base. In this embodiment, a lighting device with a higher light intensity may be constructed, still without compromising the COA and not enlarging the device extensively. Further, with several LED chips a better control of the emitted light can be reached.

In one embodiment, the chip aligned with the edge of the base has at least one point in contact with, or adjacent to, the edge of the base and the shortest side of the second chip is aligned with an extension of the shortest side of the first chip. The present embodiment provides a design with decreased color variation while allowing for simpler manufacturing of the device by placing the chips in the same orientation.

In one embodiment, the chip aligned with the edge of the base has two points in contact with, or adjacent to, the edge of the base and the longest side of the chip is aligned with a tangential direction of the edge between the two points of the base. It is appreciated that the two points of the base corresponds to the two points in contact with, or adjacent to, the chip aligned with the edge of the base.

The term "tangential direction" in the present disclosure means the direction of the derivative or slope at a point on a shape.

In one embodiment, a third chip of the one or more LED chips is arranged in a position further from the central axis than the first chip and closer to the central axis than the second chip. In this embodiment, a lighting device with more chips and an even higher light intensity may be constructed without compromising the COA. Further, with several LED chips a higher degree of customization and better control of the emitted light can be reached.

In one embodiment, the base has a rectangular shape or a square shape. In some embodiments, an axis along which one or more chips has its longest extension is aligned with an axis along which the base has its longest extension. As a result, a lighting device with a further improved COA can be achieved.

In one embodiment, the base has one of a circular-like shape (such as a circle) or an elliptical-like shape (such as an ellipse).

In one embodiment, the base has a bowl like shape or any other shape with side walls. The side walls may be surrounding the chips and dielectric and may be reflective, diffusely reflective, blocking or a combination thereof. In the present embodiment, the two or more chips are typically arranged on the bottom of the base. The top of the base, opposite the chips, may form an opening functioning as an emitting window for transmitting light emitted from the chips. In this embodiment, the light transmissive dielectric material may be applied by filling the bowl shaped base. The dielectric may typically be mixed with a phosphor to convert part of the blue emitted light into white light.

In one embodiment, the lighting device further comprises an optical component arranged to form a beam from the light emitted along the direction. In one embodiment, light emitted from the device is collimated into a beam. In another embodiment, depending on the application, the optical component is also utilized for diffusing the emitted light.

It will be appreciated that different optical components may be utilized to form the output of the device. For example, components such as lenses and mirrors may be used to collimate or spread the light.

In one embodiment, the central axis of the device coincides with the optical axis of the optical component. With such a design, a better color uniformity may be achieved. The present embodiment may also result in a simplified mounting procedure by allowing for a more robust alignment of the base, since misalignments may be corrected by a properly aligned optical component.

It will appreciated that in some other embodiment the central axis of the device may not coincide with the optical axis of the optical component.

In one embodiment, the central axis extends through the center of the base in the direction of the emitted light, which results in a device that may be easier to align, thereby simplifying the manufacturing process.

In one embodiment, the one or more LED chips is shaped like a square, a rectangle, a triangle, a parallel trapeze, a polygone, or a portion of such shapes.

It will be appreciated that other embodiments using all possible combinations of features recited in the above described embodiments may be envisaged.

SHORT DESCRIPTION OF THE APPENDED DRAWINGS

The invention is described in the following illustrative and non-limiting detailed description of exemplary embodiments, with reference to the appended drawings, wherein:

FIG. 4 is a schematic illustration of a lighting device with two LED chips according to an embodiment.

FIG. 5 is a schematic illustration of a lighting device with a LED-chip and an optical component according to an embodiment.

FIG. 6 is a perspective view of a lighting device with two LED chips according to an embodiment.

FIG. 7 is a perspective view of a lighting device with two LED chips according to an embodiment.

All figures are schematic, not necessarily to scale, and generally only show parts which are necessary in order to elucidate the invention, wherein other parts may be omitted or merely suggested. Throughout the figures the same reference signs designate the same, or essentially the same features.

DETAILED DESCRIPTION

Exemplifying embodiments will now be described more fully hereinafter with reference to the accompanying drawings, in which currently preferred embodiments are shown. The invention may, however, be embodied in many different forms and should not be construed as limited to the embodiments set forth herein; rather, these embodiments are provided for thoroughness and completeness, and fully convey the scope of the invention to the skilled person.

Figure 1A:
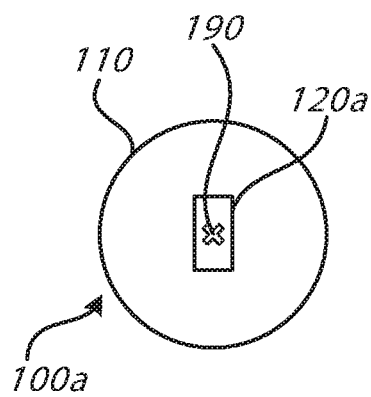
FIG. 1a is a schematic illustration of a typical chip layout for a LED-based lighting device.

With reference to FIG. 1a, a known system comprising a light emitting chip is described.

FIG. 1a shows a schematic illustration of a typical one chip layout for a LED based lighting device 100a. A chip 120a is centered with respect to the center, or central axis, 190 of a base 110. The chip emits light which then propagates out from the device.

Figures 2A, 2B, 2C:
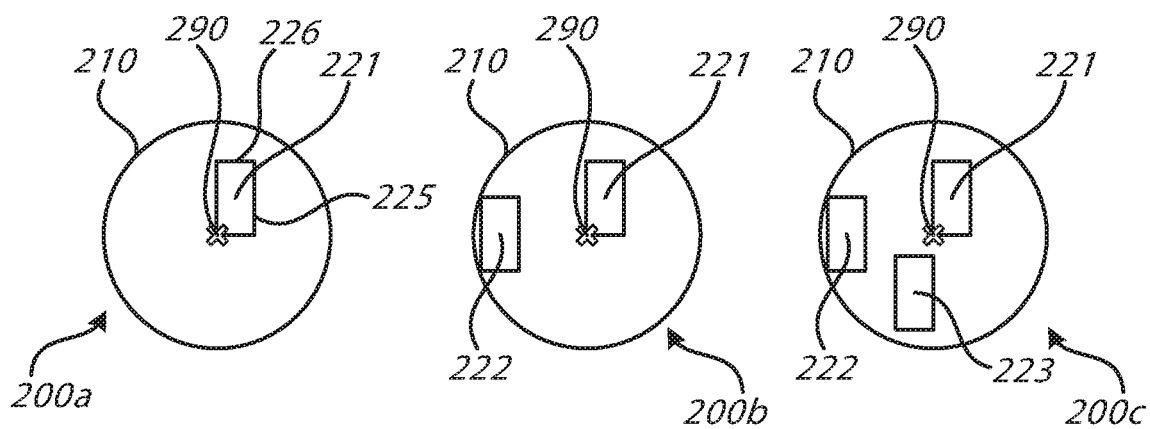
FIG. 2a is a schematic illustration of a lighting device with a LED-chip according to an embodiment.
FIG. 2b is a schematic illustration of a lighting device with two LED chips according to an embodiment.
FIG. 2c is a schematic illustration of a lighting device with three LED chips according to an embodiment.

FIGS. 2a, b and c show a schematic illustration of a lighting device according to embodiments of the invention with one, two or three light emitting chips, respectively.

The lighting device 200a shown in FIG. 2a is equivalent to the light emitting device 100a described with reference to FIG. 1a except that the light emitting diode chip 221 is not centered with respect to the center, or central axis, of the base 210. In this embodiment, the chip 221 is arranged in such a way that one corner of the chip 221 coincides, or at least closely coincides, with a central axis 290 of the lighting device 200a. The chip 221 is arranged to emit light in a direction outwards from the base 210.

The base 210 is in the present figure illustrated as a circular shape with an indicator marking its center position or central axis 290. The chip 221 has a rectangular shape and is positioned with one corner at the center of the base. The chip fits inside the base and is in this case illustrated with a long side 225 that is approximately ⅔ of the radius of the base and a short side 226 of the chip that in this case is approximately ½ of its long side.

The lighting device 200b shown in FIG. 2b is equivalent to the lighting device 200a described with reference to FIG. 2a except that a second chip 222 is arranged at an edge of the base 210 so that a longest side of the second chip 222 is aligned with the edge of the base 210 (and in the particular example shown in FIG. 2b in contact with, or adjacent to, the edge of the base 210). The second chip 222 is also arranged to emit light in a direction outwards from the base 210.

The second chip 222 is in the present figure illustrated in a similar size and orientation as the first chip 221, it is however located at a different position, as indicated above, thereby providing an asymmetric distribution of the locations or positions of the LED chips with respect to the central axis 290.

The lighting device 200c shown in FIG. 2c is equivalent to the lighting device 200b described with reference to FIG. 2b except that a third chip 223 is arranged at a position further from the central axis 290 than the first chip 221 and closer to the central axis 290 than the second chip 222, for example when taking a center, such as a center of gravity, of the LED chips as reference point for determining the distance to the central axis. In other words, the third chip 213 is arranged, in a polar coordinate system centered at the central axis 290 (or at the center of the base 210), between the first chip 221 and the second chip 222. The third chip 223 is also arranged to emit light in a direction outwards from the base 210.

The third chip 223 is in the present figure illustrated in a similar size and orientation as the first chip 221 and the second chip 222, it is however located at a different position, as indicated above, thereby providing an asymmetric distribution of the locations or positions of the LED chips with respect to the central axis 290.

Figures 3A, 3B, 3C:
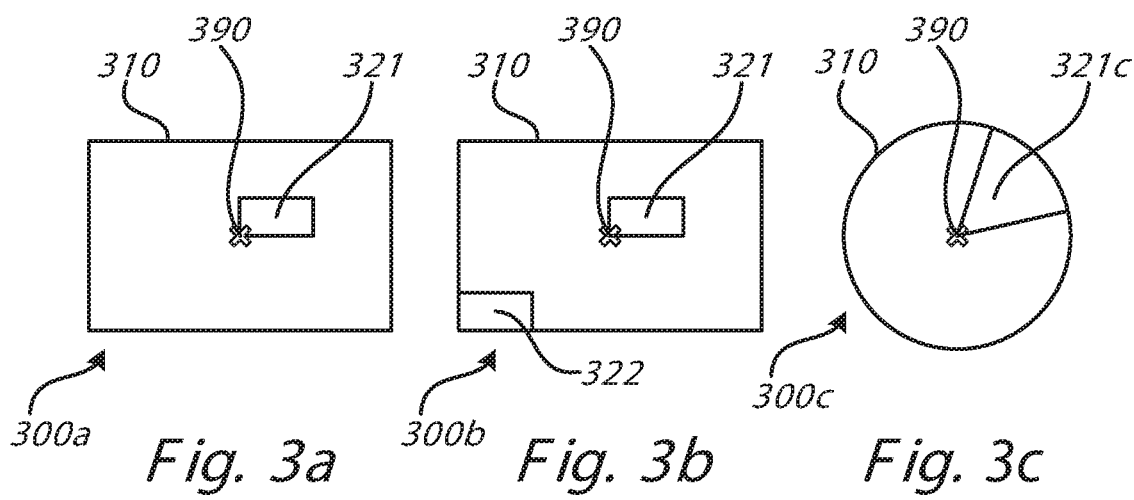
FIG. 3a is a schematic illustration of a lighting device with a LED-chip according to an embodiment.
FIG. 3b is a schematic illustration of a lighting device with two LED chips according to an embodiment.
FIG. 3c is a schematic illustration of a lighting device with a LED-chip according to an embodiment.

The lighting device 300a shown in FIG. 3a is equivalent to the lighting device 200a described with reference to FIG. 2a except that the base 310 has a rectangular shape and that an axis along which the longest side of the chip 321 extends is aligned with an axis along which the longest side of the base (or cup) extends. The chip 321 is arranged to emit light in a direction outwards from the base 310.

The base 310 is in the present figure illustrated as a rectangular shape with an indicator marking its center position or central axis 390. The chip 321 has a rectangular shape and is positioned with one corner at the center of the base 310. The chip 321 fits inside the base 310 and is in this case illustrated with a width that is approximately ½ of its length. The area of the chip 321 is about ¹⁄₂₀ of the area of the base 310. The long side of the base 310 is about 50% longer than the short side of the base 310. The axis along which the chip 321 has its longest extension is aligned with the axis along which the base 310 has its longest extension.

The lighting device 300b shown in FIG. 3b is equivalent to the lighting device 300a described with reference to FIG. 3a except that a second chip 322 is arranged at an edge of the base 310 so that a longest side of the second chip 322 is aligned with the edge of the base 310. The second chip 322 is also arranged to emit light in a direction outwards from the base 310.

The second chip 322 is in the present figure illustrated with a similar size and orientation as the first chip 321, it is however located at a different position, as indicated above, thereby providing an asymmetric distribution of the locations or positions of the LED chips with respect to the central axis 390.

The lighting device 300c shown in FIG. 3c is equivalent to the lighting device 200a described with reference to FIG. 2a except that the light emitting diode chip 321c has another shape. The shape of the chip 321c is a portion (or section) of a circle and the position of the chip 321c is such that the apex or tip of the chip being shaped as a circle section coincides with the center 390c of the circular base 310c.

The illustrated chip 321c has a shape with three corners where one corner (or apex) is positioned at the center 390 of the base 310 and the other two at the edge of the base 310. The two sides of the chip 321c intersecting at the center 390 are straight and the one side not intersecting at the center 390 has the shape of a partial circle along the edge of the base 310. The chip 321c fits inside the base 310 and is in this case illustrated with an area corresponds to about ⅙ of the area of the base 310.

The lighting device 400 shown in FIG. 4 is equivalent to the lighting device 200a described with reference to FIG. 2a except that a second chip 422 may be in contact with, or adjacent to, the edge of the base 410 so that the second chip 422 has one point in contact with, or adjacent to, the edge of the base 410. In this embodiment the shortest side of the second chip 422 is aligned with the extension of the shortest side of the first chip 421. The second chip 422 is also arranged to emit light in a direction outwards from the base 410.

The second chip 422 is in the present figure illustrated in a similar size and orientation as the first chip 421, it is however located at a different position, as indicated above, thereby providing an asymmetric distribution of the locations or positions of the LED chips with respect to the central axis 490.

The lighting device 500 shown in FIG. 5 is equivalent to the lighting device 200a described with reference to FIG. 2a except that the chip 521 may be aligned with reference to an optical axis 595 of an optical component. The chip 521 is not centered at the center of the base 510 but is arranged so that one corner of the chip 521 coincides, or at least closely coincides, with a central axis 595 of said optical component, where the central axis 595 is the optical axis 595 of the optical component. It will be appreciated that the central axis 590 of the base may, or may not, coincide with the central axis of the device or the optical component. The one or more chips may be arranged with reference to any central axis of the device, such as the central axis 590 of the base or the central axis 595 of the optical component.

The chip 521 is in the present figure illustrated in a similar size and orientation as the chip 221 described with reference to FIG. 2a, it is however positioned according to the disclosure above. In the present illustration the distance between the optical axis 595 and the central axis 590 of the base is approximately ½ the length of the shortest extension of the chip 521, the position of the central axis 590 of the base is in the direction in which a short side of the chip 521 extends.

The lighting device 600 with a base 610, a first chip 621, a second chip 622 and a central axis 690 shown in FIG. 6 is equivalent to the lighting device 200b described with reference to FIG. 2b.

The light transmissive dielectric material 680 embedding the LED chips 621 and 622 is in the present figure illustrated as a cylindrical shape extending from the base 610. Through the center of the dome and the center of the base an axis 690 extends. The dielectric material may be silicone, epoxy or similar substances. The dielectric material may include luminescent material to convert part of the blue emitted light into white light. A common luminescent material is for example Ce;YAG but other phosphors or phosphor combinations can be used, for example the Ce and Eu activated red and yellow phosphors. Further, scattering agents like TiO or other white pigments can be added to the dielectric material.

The lighting device 700 with a base 710, a first chip 721, a second chip 722 and a central axis 790 shown in FIG. 7 is generally equivalent to the lighting device 600 described with reference to FIG. 6 except that the base 710 has another shape. The base 710 is shaped as a bowl or cup, in which the first chip 721 and the second chip 722 are positioned.

The base 710 is in the present figure illustrated by a flat circular area where the chips are arranged. At the rim of that circular area, a side wall extends evenly upwards, thus forming a bowl. In the present figure the light transmissive dielectric material 780 is illustrated as filling the bowl shaped base 710, thus covering the chips.

For explanatory purposes rectangular chips have been used, however embodiments of the appended claims are not limited to such usage. For an example, chips formed as a triangle, square, a circle, an ellipse, a parallelogram, or a segment from either one of them may be used.

While specific embodiments have been described, the skilled person will understand that various modifications and alterations are conceivable within the scope as defined in the appended claims.

The invention claimed is:

1. A lighting device configured to emit light along an output direction, said device comprising:
   a base, having a rectangular or square shape, on which a maximum of three light emitting diode (LED) chips are asymmetrically distributed with respect to a central axis of said lighting device, wherein said LED chips are arranged to emit light in said output direction, the base providing a rectangular or square surface surrounded by side walls at edges of the rectangular or square surface;
   a light transmissive dielectric material embedding LED chips, said light transmissive dielectric material including luminescent material, the light transmissive dielectric material covering the rectangular or square surface between the side walls;
   wherein a first chip of said LED chips is placed closest to the central axis, wherein no other LED chip is closer to the central axis than the first chip;
   wherein said first chip is arranged so that the central axis and said first chip coincide at a corner of said first chip, or the central axis and the first chip do not coincide and the distance between the central axis and a corner of said first chip closest to the central axis is not larger than 1/10 of the size of the base; and
   wherein a second chip of said LED chips is arranged at an edge of said rectangular or square surface next to one of the side walls so that a side of said second chip is abutting the edge of said rectangular or square surface.

2. The lighting device according to claim 1, wherein said second chip has at least one point adjacent to the edge of said base and a side of said second chip is aligned with an extension of a side of said first chip.

3. The lighting device according to claim 1, wherein a third chip of said LED chips is arranged in a position further from said central axis than said first chip and closer to said central axis than said second chip.

4. The lighting device according to claim 1, further comprising:
   an optical component arranged to form a beam from the light emitted along said direction.

5. The lighting device according to claim 4, wherein said central axis coincides with an optical axis of said optical component.

6. The lighting device according to claim 1, wherein said central axis extends through the center of said base in the output direction of the emitted light.

7. The lighting device according to claim 1, wherein said LED chips is shaped like a triangle, square, a rectangle, a parallel trapeze, a polygon, or a portion of such shapes.

* * * * *